United States Patent
Feldtkeller

(10) Patent No.: US 9,780,766 B1
(45) Date of Patent: Oct. 3, 2017

(54) PHASE SHIFT CLOCK FOR DIGITAL LLC CONVERTER

(71) Applicant: Infineon Technologies Austria AG, Villach (AT)

(72) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/153,494

(22) Filed: May 12, 2016

(51) Int. Cl.
| H03K 3/00 | (2006.01) |
|---|---|
| H03K 5/135 | (2006.01) |
| H03K 19/0175 | (2006.01) |
| H03K 17/687 | (2006.01) |
| H03K 5/00 | (2006.01) |

(52) U.S. Cl.
CPC .......... H03K 5/135 (2013.01); H03K 17/687 (2013.01); H03K 19/017509 (2013.01); H03K 2005/00286 (2013.01)

(58) Field of Classification Search
CPC ...................................................... H03K 5/135
See application file for complete search history.

(56) References Cited

U.S. PATENT DOCUMENTS

| 6,943,604 | B2 | 9/2005 | Minzoni |
|---|---|---|---|
| 6,996,026 | B2 | 2/2006 | Brox et al. |
| 7,279,946 | B2 | 10/2007 | Minzoni |
| 8,081,024 | B1 * | 12/2011 | Evans ........................ H03K 5/13 327/175 |
| 8,786,375 | B2 | 7/2014 | Feldtkeller |
| 2007/0046346 | A1 | 3/2007 | Minzoni |

OTHER PUBLICATIONS

"DC-DC Converter," Infineon Products, retrieved from http://www.infineon.com/cms/en/product/power/dc-dc-converter/channel.html?channel=db3a304319c6f18c011a15481a64270b on May 12, 2016, 10 pp.
"Q&A GaN," Infineon, Feb. 2015, 6 pp.
"Setting the P-I Controller Parameters, KP and KI," Infineon, Automotive Power, Application Note TLE7242 and TLE8242 V2.0, Oct. 2009, 13 pp.
Abdel-Rahman, "Resonant LLC Converter: Operation and Design, 250W 33Vin 400Vout Design Example," Infineon, Application Note AN Sep. 2012 V1.0, Sep. 2012, 19 pp.
Lind, "LLC Converter Design Note," Infineon, Design Note AN Mar. 2013 V1.0, Mar. 2013, 19 pp.

(Continued)

*Primary Examiner* — Daniel Puentes
(74) *Attorney, Agent, or Firm* — Shumaker & Sieffert, P.A.

(57) ABSTRACT

The techniques of this disclosure may digitally generate a driver signal with a period (or frequency) at a finer resolution than can be achieved by simply counting clock cycles of a system clock. The driver signal may be configured to trigger based on single output clock signal that may be phase-shifted relative to the master system clock. A clock phase shift circuit may increment the phase shift of the output clock signal to any fraction relative to the master system clock. A driver signal generated based on the phase-shifted output clock may achieve the high resolution in frequency desirable when controlling some pulse-width modulated circuits, such as an LLC converter.

12 Claims, 8 Drawing Sheets

(56) References Cited

OTHER PUBLICATIONS

Maniktala, "Understanding and using LLC Converters to Great Advantage, Part 1: Overview of the Transition from conventional PWM Power Conversation to Resonant Topologies," Microsemi, Mar. 2013, 33 pp.

O'Loughlin, "LLC LED driver design simplified," Electronic Products, Power Management, retrieved from http://www.electronicproducts.com/Power_Products/Power_Management/LLC_LED_driver_design_simplified.aspx, Sep. 16, 2011, 5 pp.

Persson, "Practical Application of 600 V GaN HEMTs in Power Electronics," 30th Applied Electronics Conference and Exposition, Professional Education Seminar S17, Mar. 16, 2015, 77 pp.

Schimel, "Use the LLC Half Bridge in Your Offline Converters," Electronic Design, retrieved from http://electronicdesign.com/archive/use-llc-half-bridge-your-offline-converters, Feb. 15, 2011, 4 pp.

Yang, "Chapter 4: LLC Resonant Converter," retrieved from https://theses.lib.vt.edu/theses/available/etd-09152003-180228/unrestricted/Ch4.pdf on May 12, 2016, 48 pp.

\* cited by examiner

US 9,780,766 B1

PHASE SHIFT CLOCK FOR DIGITAL LLC CONVERTER

TECHNICAL FIELD

The disclosure relates to generating control signals for frequency-modulated circuits.

BACKGROUND

Some frequency-modulated circuits have a steep transfer curve of output power vs. input frequency. A small frequency change in the input signal may result in a large output change, and therefore, accurate control of the input signal frequency may be desirable. In some examples, generating input signals by counting whole clock cycles of a system clock may not yield a resolution fine enough to accurately control the input signal frequency. Some techniques to increase resolution may also increase system power consumption or increase system complexity and cost.

SUMMARY

In one example, the disclosure is directed to a system comprising: a master input clock; a clock phase shift circuit, configured to: output a second clock signal wherein a second clock signal frequency is approximately the same frequency as a master input clock frequency, and increment a phase shift of the second clock signal relative to the master input clock; and a control unit configured to: receive the second clock signal, generate a driver signal at a predetermined frequency, wherein the phase shift of the second clock signal relative to the master input clock sets a fractional part of a frequency ratio between the master input clock frequency and the predetermined frequency.

In another example, the disclosure is directed to a clock circuit comprising, a capacitor; a capacitor discharge period, wherein the capacitor discharge period includes a duration comprising the time between a start of the capacitor discharge period and an end of the capacitor discharge period; a charging current unit configured to generate a charging current at a plurality of amperage levels, wherein: the charging current charges the capacitor for a predetermined charge time, and the predetermined charge time is synchronized to a master input clock that defines a master input clock frequency; a discharge current unit configured to: discharge the capacitor at a fixed, constant discharge current, start the capacitor discharge period at a predetermined delay after an end of the predetermined charge time; and a comparator configured to output a trigger signal in response to detecting a voltage across the capacitor crossing a predetermined threshold indicating an end of the capacitor discharge period; and wherein the clock circuit is configured to: generate a second clock signal, wherein the second clock signal includes a phase shift relative to the master input clock and the duration of the capacitor discharge period determines the phase shift.

In another example, the disclosure is directed to a method comprising: receiving, by a clock phase shift circuit, a master clock input signal, wherein the master clock input signal comprises a master clock input signal frequency; determining, by a clock phase shift circuit, a capacitor charging current; charging a capacitor, by a clock phase shift circuit, with the capacitor charging current for a predetermined charge time, wherein the predetermined charge time is synchronized to the master clock input signal; discharging the capacitor, by the clock phase shift circuit, with a fixed discharge current; determining, by the clock phase shift circuit, a discharge period, wherein the discharge period is an amount of time for a voltage of the capacitor to reach a threshold voltage; outputting, by the clock phase shift circuit, a second clock signal, wherein: a second clock signal frequency is approximately equal to the master clock input signal frequency, the second clock signal includes a phase shift relative to the master input clock and the discharge period determines the phase shift.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1A:
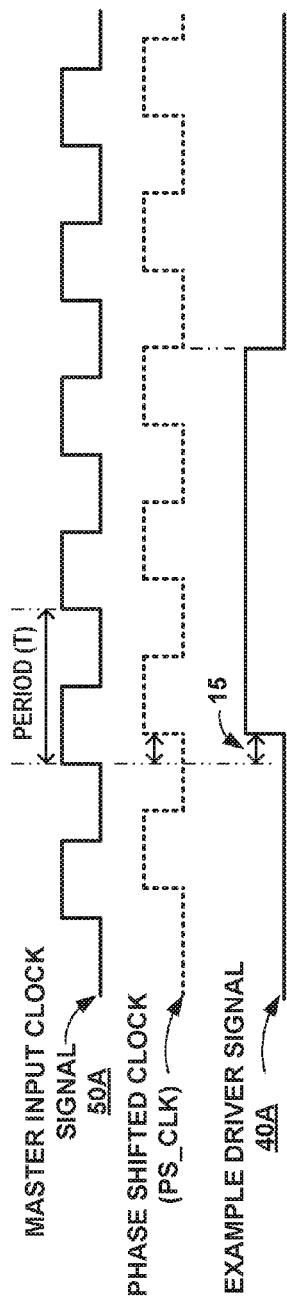
FIG. 1A is a timing diagram depicting a phase shifted clock signal used to deliver an example driver signal at a predetermined time with finer resolution than the master input clock frequency.

The systems, circuits and techniques described in this disclosure may digitally generate a driver signal with a period (or frequency) at a finer resolution than can be achieved by simply counting clock cycles of a system clock. The driver signal may be configured to trigger based on single output clock signal that may be phase-shifted relative to the master system clock. A clock phase shift circuit may increment the phase shift of the output clock to any fraction of the master system clock period. The system may use the phase shifted output clock to generate driver signals with high-resolution frequency. Some example applications for such a driver signal may include generating the on-times or half periods for a frequency modulated power converter like an LLC or LCC converter or other frequency-modulated circuit. One specific example may include an LLC converter for high voltage DC to AC conversion, however, the techniques disclosure may be used for any application that requires fine resolution in the frequency of a driver signal.

Because the transfer curve, i.e. the output power vs. input frequency, for an LLC converter is very steep, a small change in frequency may result in a large output change. Therefore, it may be desirable to very accurately control the frequency of signals for LLC and other resonant converters. One simple technique to digitally generate the on-time and half-period control signals for an LLC converter is by counting clock cycles and choosing the clock frequency high enough to meet the required frequency resolution. For example, a 50-100 MHz master system clock may generate half-period signals for an LLC converter operating at 50 to 100 kHz. In this example, the resolution for the duration of a half period may be on the order of 0.2%, which may be good enough for most applications. The resolution may be increased using some dithering. However, dithering may have disadvantages in terms of undesirable noise on the output current.

To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits. High frequency power converters may require half-period signals on the order of 1 MHz or greater. Generating 1 MHz half-period driver signal directly from a 50 MHz clock may result a four percent (4%) resolution, which may be insufficient to operate a 1 MHz LLC converter for acceptable performance. Switching to a higher frequency system clock may have the disadvantage of higher power consumption and therefore unattractive for achieving a high overall system efficiency. A higher frequency master clock may also lead to increased expense in circuit design and shielding to avoid electromagnetic interference (EMI) that may be more prevalent with higher frequency system clocks.

Splitting a lower frequency system clock into fractions by small phase shifts is one technique to generate pulse-width modulated (PWM) control signals at high resolution. As an example, one particular technique may include a large number of delay elements and a multiplexor to select from a large number of phase-shifted signals. A delay locked loop (DLL) may adjust the total delay time of all delay elements to match the period of the system clock. The multiplexor and DLL technique may allow direct selection of a desired delay, but may have a disadvantage of complexity and settling time of the DLL. Another example approach may measure the number of unadjusted delays which fit into one clock period and to divide the desired delay by the number of unadjusted delays. This technique may have a disadvantage in that it may need some overhead count of delay elements for component tolerances as well as temperature drift and may require one division for each PWM cycle.

In this disclosure, a single phase shifted clock that may increment the amount of the phase shift relative to the master input clock, may have an advantage of lower complexity and include fewer components than other techniques. A driver signal generated based on the phase-shifted clock may achieve the high resolution in frequency desirable when controlling pulse-width modulated circuits such as an LLC converter.

FIG. 1A is a timing diagram depicting a phase shifted clock signal used to deliver an example driver signal at a predetermined time with finer resolution than the master input clock frequency. Example driver signal 40A starts and stops according to the timing of the phase shifted clock PS_CLK at a predetermined time that is in between the master input clock 50 pulses. In other words, at some predetermined time that is a fraction of a master clock period (T).

Phase shifted clock PS_CLK may be approximately the same frequency of master input clock 50. Phase shifted clock signal PS_CLK may shift by a predetermined amount of time 15 from master input clock 50. Example driver signal 40A may be configured to trigger based on the phase-shifted clock PS_CLK rather than based on master input clock 50. Though not shown in FIG. 1A, incrementing the phase shift of PS_CLK between the start and stop time of example driver signal 40A may result in example driver signal 40A with a duration that is some fraction of the master input clock signal period T. In this way example trigger signal 40A may start, and stop, at a predetermined time 15 that has finer resolution than available from the master input clock 50. The capability for finer resolution using a single phase shifted clock will be explained in further detail below.

Figure 1B:
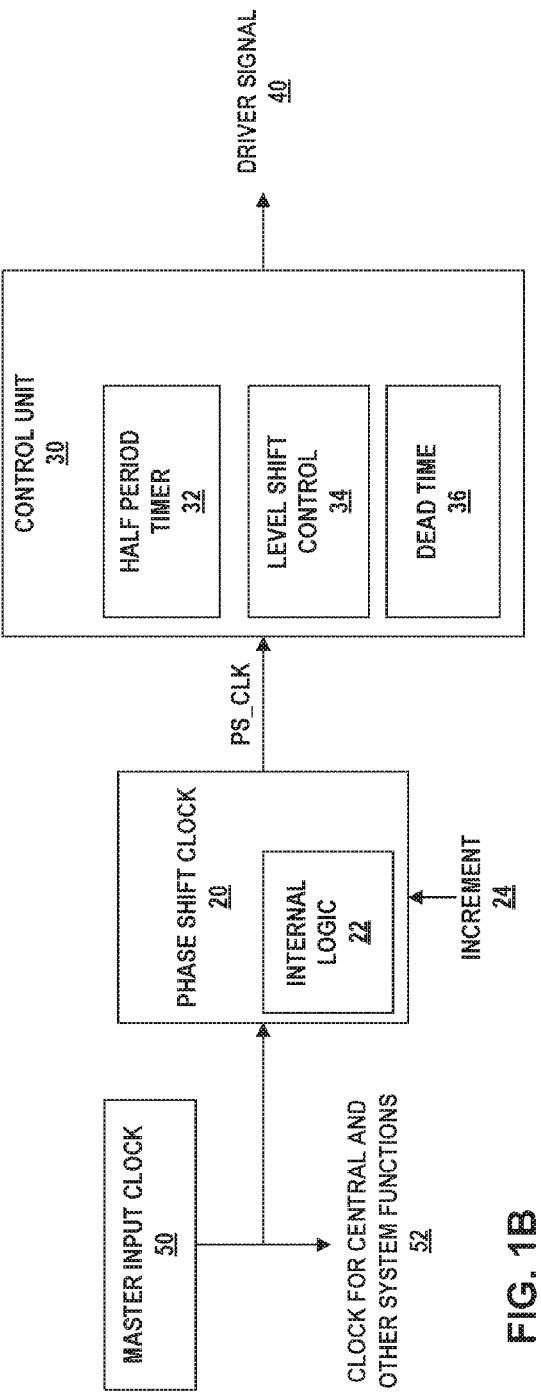
FIG. 1B is a conceptual and schematic block diagram illustrating an example driver signal generation system that includes a clock phase shift circuit in accordance with one or more techniques of this disclosure.

FIG. 1B is a conceptual and schematic block diagram illustrating an example driver signal generation system that includes a clock phase shift circuit in accordance with one or more techniques of this disclosure. The driver signal system 1 may generate driver signals at finer frequency resolution than can be achieved by counting clock cycles of a master system clock 50.

Driver signal system 1 may have a variety of applications. Frequency modulated devices or systems may use driver signal system 1 as a control input. For example, a frequency modulated power converter like an LLC or LCC converter or a converter that uses a piezo transformer. To take advantage of higher power density requirements in some circuits, power converters may operate at higher frequencies. These higher frequency circuits may deliver better performance when receiving control signals with more precise timing than control signals for lower frequency circuits. For example, in addition to accurate timing for the 50% duty cycle input, a higher frequency LLC or LCC power converter may perform better when receiving other control signals that start and stop at predetermined times between master clock pulses, as shown above in FIG. 1A. Some examples may include dead-time signals or level-shifter control pulses.

Driver signal system 1 (system 1, for short), may include a master input clock 50, a clock phase shift circuit 20, a control unit 30 and output the driver signal 40. Example, clock phase shift circuit 20 may include internal logic 22. Control unit 30 may include half-period timer 32, level shift control 34 and dead time unit 36. Other examples of control unit 30 may include more or fewer components. Master input clock 50 may output a master clock signal that goes to clock phase shift circuit 20 as well as to other functions of the system 52. The output of clock phase shift circuit 20 connects to control unit 30 and control unit 30 may output driver signal 40. Driver signal 40 may include the 50% duty cycle driver signal, dead-time signals and other control signals.

Control unit 30 may receive the phase shifted clock signal and generate driver signals at a predetermined frequency and timing to control other circuits, such as to control a frequency modulated power converter. Control unit 30 may include units that receive the phase shifted clock input and generate control signals at predetermined times that may be at finer resolution than that available from master input clock 50. A unit within control unit 30 may generate a driver signal at a predetermined time different from a clock edge of master clock 50 by utilizing the phase shift clock signal. For example, half-period timer unit 32 may start a half-period driver signal 40 at a predetermined time that is shifted from master clock 50, such as by 0.35 of the master clock period (0.35T). Similarly level shift control unit 34 and dead time unit 36 may generate a drive signal that starts at the same predetermined phase shift (0.35T) or a different phase shift. For example, level shift control unit 34 may send a level shift control driver signal after phase shift clock 20 increments the phase shift from 0.35T to 0.5T. In this way, each unit within control unit 30 may generate a driver signal at a predetermined time to operate the circuit being controlled, such as the power converter, at an optimum performance.

Phase shift clock 20 may deliver a single clock signal to control unit 30 that is phase-shifted from the master input clock signal. In response to an increment command 24, phase shift clock 20 may gradually increase the phase shift of a second output clock signal (PS_CLK) by incrementing the phase shift with each master clock cycle. For example, phase shift clock 20 may gradually increase the phase shift of PS_CLK from 0.35T to 0.5T, relative to master clock signal 50A, in increments of 0.05T per master input clock cycle. In contrast to clock phase shift circuits that may generate multiple phase-shifted signals generated by multiple delay elements, clock phase shift circuit 20 may have the advantages of low complexity for generating the phase shifted second output clock signal and a quick start up time of only a few clock cycles. An example implementation of phase shift clock unit 20 will be detailed by FIG. 3 below.

Phase shift clock 20 may include internal logic 22. Internal logic 22 may include feedback and control components that may utilize master input clock signal from master input clock 50 to trigger timing circuits to increment the phase shift the second output clock signal PS_CLK until PS_CLK reaches a desired phase shift. In response to an increment command 24, internal logic 22 may further increment the phase shift of second output clock signal PS_CLK relative to master input clock 50 until a PS_CLK reaches a second desired phase shift.

In operation, internal logic 22 may increment the phase shift of PS_CLK to 0.5T in response to an increment command 24. Phase shift clock 20 may deliver the phase shifted clock signal PS_CLK at 0.5T to control unit 30. Control unit 30 may start a half-period driver signal 40 based on PS_CLK at 0.5T. Internal logic 22 may further increment the phase shift of PS_CLK to 0.65T, relative to master clock 50, and deliver to control unit 30 the phase-shifted clock signal PS_CLK at 0.65T. Control unit 30 may end the half-period driver signal based on PS_CLK at 0.65T. System 1 may repeat this process. In this way, system 1 may generate a half-period driver signal at a predetermined frequency that is at a finer resolution than the resolution available from master input clock 50 alone. The phase-shifted clock signal PS_CLK may set the fractional part of the frequency ratio between the master input clock signal from master input clock 50 and the predetermined frequency of the half-period driver signal. Further details of generating a driver signal at a predetermined frequency that is, at least in part, a fractional ratio of the master input clock signal will be detailed in timing diagrams below.

Figure 2A:
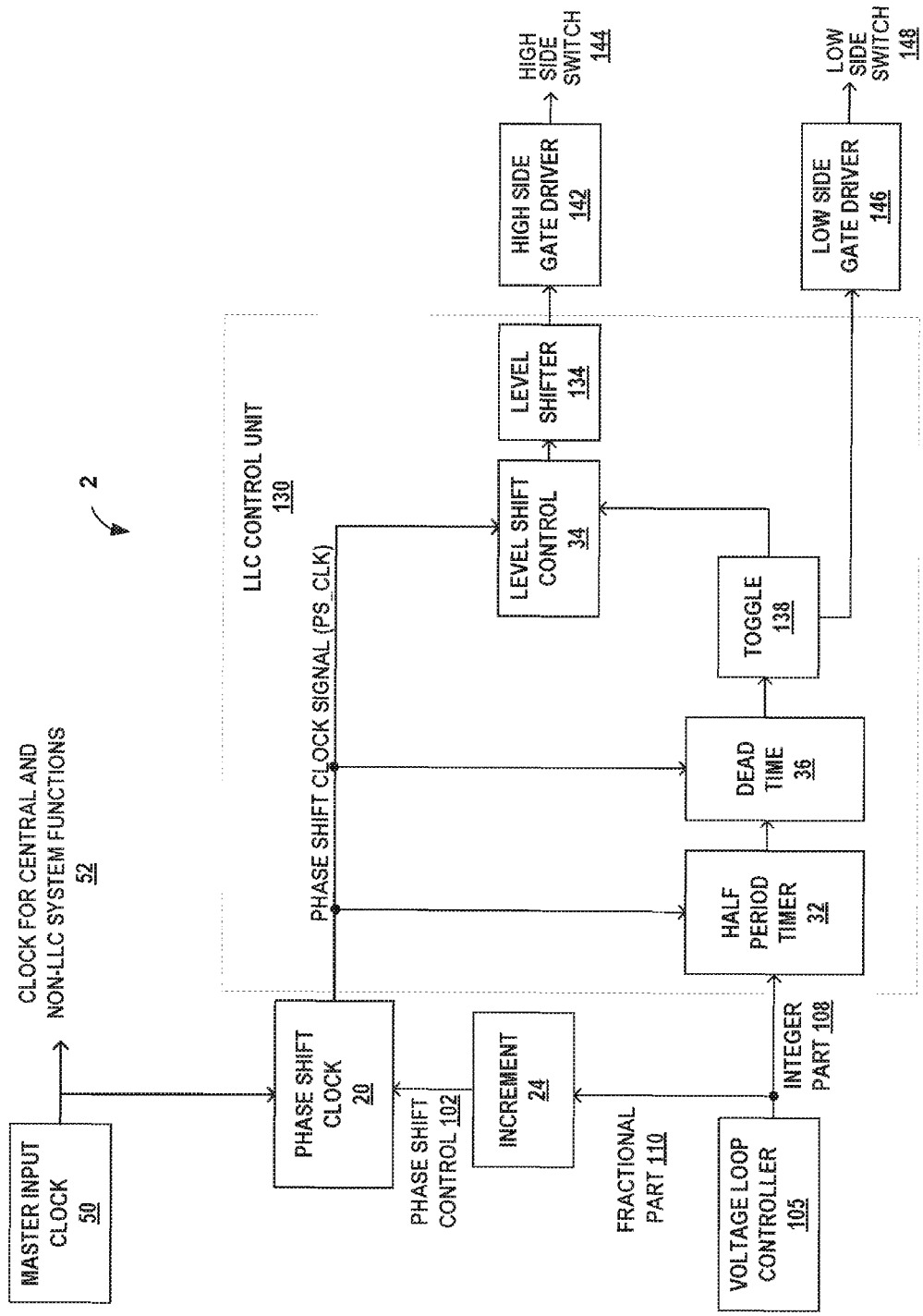
FIG. 2A is a conceptual and schematic block diagram illustrating an example system for generating a driver signal utilizing a clock phase shift circuit in accordance with one or more techniques of this disclosure.

FIG. 2A is a conceptual and schematic block diagram illustrating an example system for generating a driver signal utilizing a clock phase shift circuit in accordance with one or more techniques of this disclosure. FIG. 2A illustrates example system 2 that is analogous to system 1 as shown in FIG. 1B. Example system 2 depicts a driver signal generation system in more detail than FIG. 1 and system 2 is directed to controlling a frequency modulated LLC converter. Other examples of system 2 may deliver driver signals that control other components or circuits.

Example system 2 may include a master input clock 50, a phase shift clock 20, an increment module 24 and an LLC control unit 130, analogous to example system 1 in FIG. 1B. Components of system 2 that perform the same function as for system 1 may retain the same reference characters as for system 1. System 2 may also include a voltage loop controller 105, a high side gate driver 142, which may output a signal to a high side switch 144 and low side gate driver 146, which may output a signal to a low side switch 148. LLC control unit 130 may include a half-period timer module 32, a dead time module 36 and a level shift control module 34, analogous to control unit 30 of system 1. LLC control unit 130 may also include level shifter 134, and toggle module 138.

System 2 may deliver driver signals to an LLC converter, such as LLC converter for high voltage DC to AC conversion. Driver signals from system 2 may control a high side switch 144 and a low side switch 148 that may be part of an example LLC converter. In the case of an LLC converter, the driver signal may include an LLC half-bridge driver signal. System 2 may be configured to deliver driver signals a predetermined timing or at a predetermined frequency with a finer resolution than the resolution available from master clock 50. The predetermined frequency of the driver signal may include an integer part generated by counting clock cycles based on master input clock 50 and the fractional part generated by shifting the phase of the second clock signal PS_CLK. In the example of system 2, the half-period timer may count clock cycles of PS_CLK to determine the integer part of the driver signal frequency because in this example PS_CLK has approximately the same frequency as master input clock 50. For example, system 2 may drive an example LLC converter configured to operate at 1 MHz. Master clock 50 may be configured for 50 MHz. Generating 1 MHz driver signal with 50% duty cycle directly from a 50 MHz clock may result a four percent (4%) resolution, which may be insufficient to operate a 1 MHz LLC converter for acceptable performance, e.g. low noise, efficiency, accurate output voltage and current or other parameters. In other words, generating a 1 MHz LLC frequency from a 50 MHz clock means 25 clock cycles for each half cycle. If the frequency needs to be increased it can only be increased by reducing the clock cycle count by one step to 24 which increases the frequency to 1.04 MHz. Therefore the resolution is 4%.

Master input clock 50 delivers a master clock signal to the clock phase shift circuit 20 as well as to other components of a larger system of which system 2 may be a part. These other components may include other central and non-LLC system functions 52. Master clock 50 may output the same master input clock signal 50A as shown in FIG. 1A.

Clock phase shift circuit 20 outputs a phase shifted clock signal PS_CLK in response to inputs from master input clock 50 and increment module 24. Phase shift clock 20 includes the same internal logic 22 shown in FIG. 1B and operates in the same manner. In some examples, clock phase shift circuit 20 may receive an input from increment module 24 in the form of a phase shift control word 102. Phase shift clock 20 may shift the phase shift clock signal (PS_CLK) by larger or smaller increments in response to the phase shift control word 102. The phrases, "phase shift clock signal" and "second output clock signal" may be used interchangeably to describe PS_CLK. Phase shift control word 102 may be any signal suitable to define the phase shift of PS_CLK against master input clock 50. In one example phase shift control word 102 may be a binary coded 3-bit to 5-bit signal. Where all least significant bit (LSB) steps are equal, a phase shift change from "all one" to "all zero" may be the same as a LSB step.

Voltage loop controller 105 may deliver signals that modify system 2 driver signals in response to monitoring an output from an LLC converter (not shown in FIG. 2A) or from other signals external to system 2. Voltage loop controller 105 may deliver a signal to LLC control unit 130 to control an integer part 108 of the predetermined frequency of the driver signal. Voltage loop controller 105 may deliver a signal to increment module 24, which may control the fractional part 110 generated by shifting the phase of the second clock signal. For example, a predetermined half-period of a driver signal for an LLC converter may be 43.67 clock cycles of the master input clock 50. For an LLC converter a "half-period" may also be called the "on-time." Voltage loop controller 105 may divide this period into the integer part 108 of the half-period (e.g. 43 clock cycles) and the fractional part 110 (e.g. 0.67 of a clock cycle). Increment unit 24 may receive the fractional part 110 to cause the clock phase shift circuit 20 to shift the phase of PS_CLK to the fractional part of a master input clock signal (e.g. 0.87T). The increment module may increment the phase shift by the fractional part during each on-time. For example, if the phase shift is 0.2T when the on-time starts, the increment module may increment the phase shift to 0.87T until the end of the on-time. The descriptions below of timing diagrams in FIG. 2B, 4-6 provide additional details.

LLC control unit 130 may receive the phase shifted clock signal PS_CLK (fractional part) and integer part signal 108, and in response, generate driver signals at a predetermined frequency and timing to control other circuits. LLC control unit 130 is analogous to control unit 30 shown in FIG. 1B. The components of LLC control unit 130 may receive the input signals and combine the outputs of each component generate a complete set of driver signals for an example LLC converter. LLC control unit 130 is just one example of how to use an incremented, single phase shifted clock signal to generate driver signals with finer resolution than that available from master input clock 50. Other examples of control units may include different components to generate different driver signals configured to control circuits other than an LLC converter.

Half-period timer 32 and dead time unit 36 may generate portions of the LLC converter driver signal. Half-period timer 32 and dead time unit 36 are analogous to the same components in control unit 30 and operate in the same manner. For example, half-period timer 32 may receive the integer part 108 of predetermined on-time for the driver signal (e.g. 43 clock cycles). For the integer portion, half-period timer 32 may count clock cycles of PS_CLK, which already includes the fractional portion. By dividing the driver signal into an integer part and a fractional part, the timer portion of half-period timer 32 may remain very simple because it need only count clock cycles.

Level shift control 34 and level shifter 134 may translate a control signal from a low side control circuit to a high side gate driver of a half bridge circuit. Some half bridge circuit, such as in LLC converters or motor drives, may operate at ultra-high voltage (UHV) levels, for example near 400V. LLC control unit 130 may use level shifter 134 and level shift control 34 to reliably transfer signals to UHV levels. Level shifter 134 may output a driver signal to high side gate driver 142 and further to high side switch 144 to control an LLC converter (not shown). Dead time generator 36 and level shift control pulse generator 34 already receive the phase shifted clock and therefore do not have to deal with any fractional clocks. Dead time generator 36 and level shift control pulse generator 34 may simply count an integer number of phase shifted clock pulses to generate begin and end of dead time and level shift control pulses. The exact duration of the pulses may not be critical for the LLC converter system and therefore can be rounded to an integer number of clock pulses. Also, by synchronizing the dead time and level shifter control pulses relative to the start or end of the half-period may have the advantage in that the dead time and level shifter show no jitter against the LLC converter operation.

Toggle unit 138 may switch output driver signal timing from half-period timer 32 and dead time unit 36 between level shift control 34 and low side gate driver 146. The signal from toggle unit 138 to low side gate driver 146, and further to low side switch 148 may not utilize a level shifter.

Generating LLC converter driver signals from a phase shifted clock may result in driver signals with finer resolution and more accurate frequency and timing than generating driver signals directly from a master input clock. Use of a phase shifted clock may include advantages such as avoiding the need to for a higher frequency master clock to achieve the same finer resolution. A higher frequency master clock may result in increased power consumption of the digital controller which may be unattractive for achieving a high overall efficiency. A higher frequency master clock may also lead to increased expense in circuit design and shielding to avoid electro-magnetic interference (EMI) that may be more prevalent with higher frequency system clocks. Further, generating clock frequencies above 100 MHz may require a phased locked loop (PLL) which may need some time to settle and therefore may increase the start-up time of the converter. A single phase shifted clock that may increment the amount of the phase shift, relative to the master input clock, may be less complex and include fewer components to phase shift clock examples that use multiple delay elements to generate multiple phase shifted output clocks.

Figure 2B:
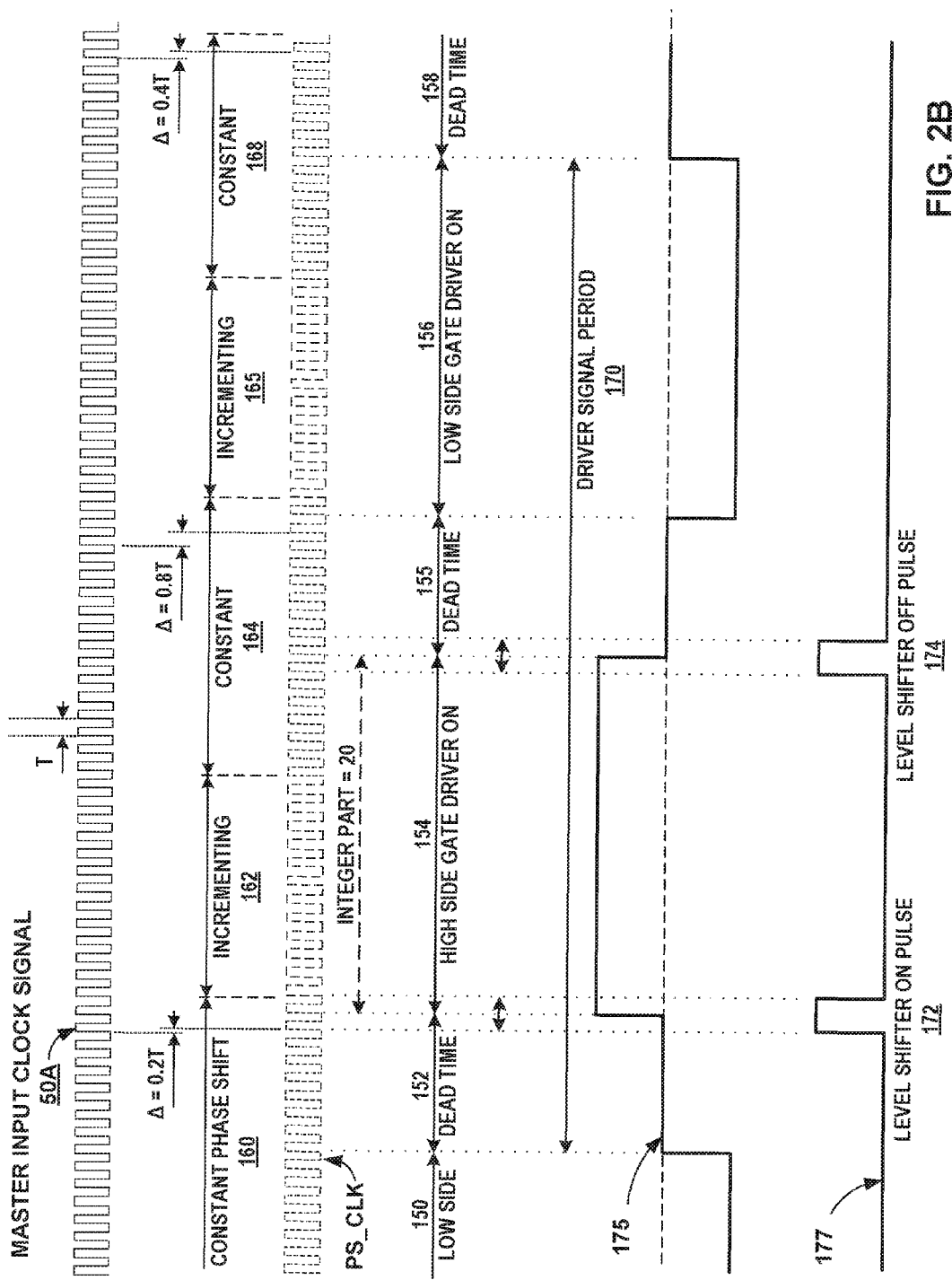
FIG. 2B is a timing diagram illustrating an example operation of an LLC converter control system of FIG. 2A.

FIG. 2B is a timing diagram illustrating an example operation of an LLC converter control system of FIG. 2A. The timing diagram of FIG. 2B illustrates driver signals with a period that may include a number of whole clock cycles of the master input clock (integer part) and offset by a portion of a clock cycle (fractional part). Elements of FIG. 2B will be explained in the context of FIG. 2A.

FIG. 2B. depicts master input clock signal 50A generated by master input clock 50 (not shown in FIG. 2B), the second output clock signal PS_CLK during incrementing and constant phase shift phases and example driver signals 175 and 177.

Master input clock signal 50A, with period T, is a longer portion of the same master input clock signal 50A depicted in FIG. 1A. Master input clock signal 50A may also provide timing signals for central and non-LLC system functions 52 as shown in FIG. 2A.

The constant phase shift 160 period of PS_CLK may occur when increment unit 24, may be inactive, or transmitting a constant phase shift signal to phase shift clock 20. Constant phase shift periods 164 and 168 are similar to period 160. Clock phase shift circuit 20 may be configured to increment the phase, in response to increment unit 24, during times when there is no time event and fix the phase during times where there is a time event. For example, a time event such as level shifter on-pulse 172 and dead time period 152 may occur during constant phase shift period 160 but not during period 162, when PS_CLK signal incrementing the phase shift relative to master input clock signal 50A. Similarly, level shifter off-pulse 174 may occur during constant phase shift period 164. Other time events (not shown) may occur during an incrementing period, such as incrementing period 165.

Driver signal period 170 of example driver signal 175 may include several intermediate components. In the example of FIG. 2B, driver signal period 170 may include dead time 152, high side gate driver on 154, dead time 155 and low side gate driver on 156. Driver signal period 170 may start after the end of the previous low side gate driver on period 150. The following driver signal period may begin with dead time 158.

System 2, from FIG. 2A, may define the predetermined frequency of driver period 170 by incrementing phase shift clock 20 to conform to a predetermined start time for driver period 170. Dead time 152 begins driver period 170 followed by a level shifter on-pulse 172 at the end of dead time 152 and start of high side gate driver on time 154. All of these timed events, i.e. dead time 152, level shifter on-pulse 172 and the start of high side gate driver on time 154 occur during the constant phase shift period 160. In the example of FIG. 2B, constant phase shift period 160 is at 0.2T relative to master input clock signal 50A.

System 2 may begin incrementing phase shift clock signal PS_CLK during incrementing period 162. By the end of incrementing period 162 and the start of constant phase shift period 164, PS_CLK may reach a predetermined phase shift relative to master input clock signal 50A so that level shifter off-pulse 174 and high side gate driver on 154 may end by synchronizing with phase shift clock signal PS_CLK. In the example of FIG. 2B, high side driver on-time 154 ends during the constant phase shift period 164, when PS_CLK is shifted 0.8T relative to master input clock signal 50A. The integer part of high side driver on-time 154 is 20 clock cycles in this example. System 2 may complete driver signal period 170 with dead time 155 and low side gate driver on period 156. System 2 may further increment PS_CLK during increment period 165 until PS_CLK reaches predetermined phase shift of 0.4T. PS_CLK may continue at a phase shift of 0.4T during the constant phase period 168 until reaching the correct number of clock cycles (integer part) to end low side gate driver on period 156. The next driver signal period may begin with dead time 158.

The example of FIG. 2B depicts the low side ON and high side ON with the same length. In the given example, both high side on and low side on have the same total length of 20 clock pulses+0.6T phase shift increase=20.6T of the master input clock period. In this way, by incrementing the phase shift of PS_CLK in small amounts, system 2 may utilize only a single second clock signal PS_CLK to achieve multiple different phase shift amounts, relative to master input clock signal 50A. By combining a phase shift fractional part with counting clock cycles (integer part), system 2 may achieve a frequency of a driver signal that may have a finer resolution than by counting clock cycles with no phase shift.

Figure 3:
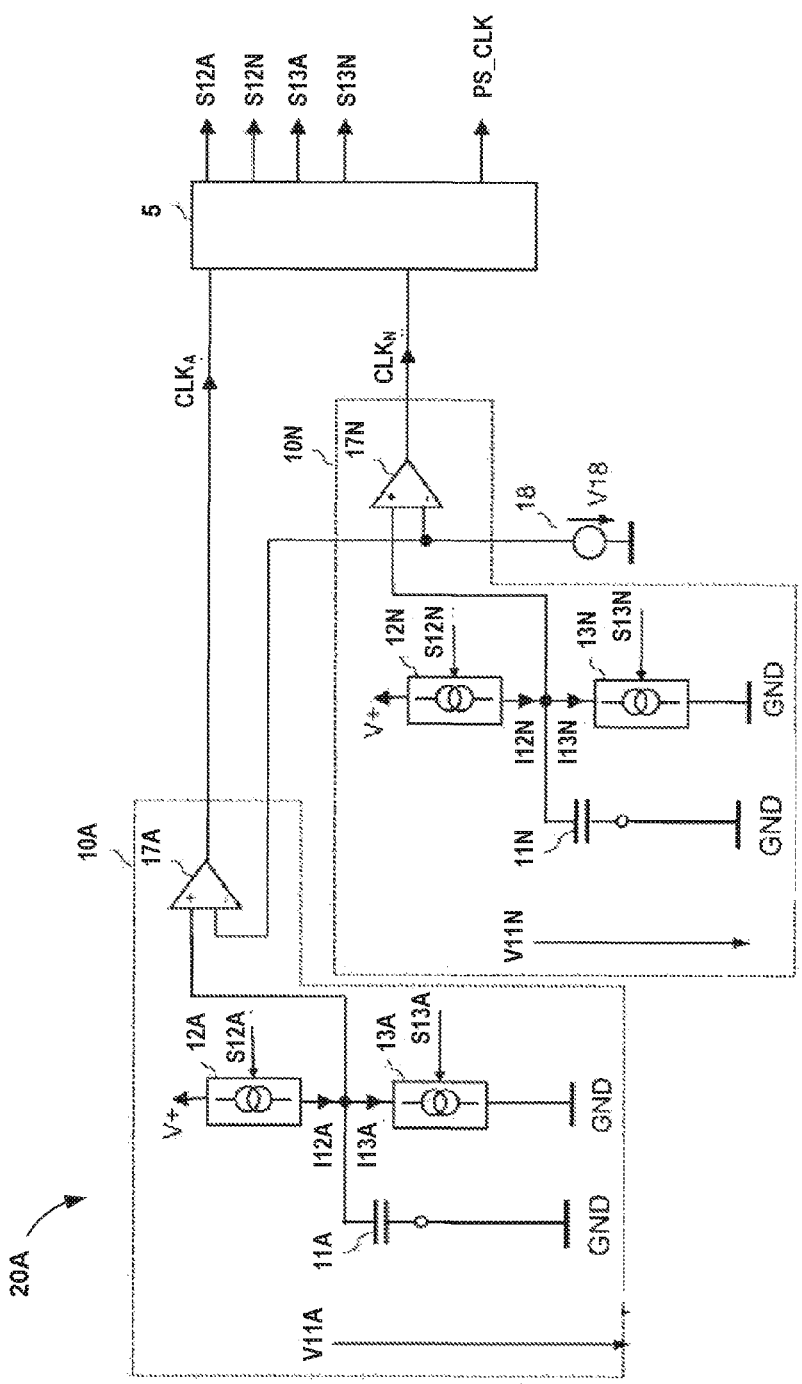
FIG. 3 is a schematic diagram illustrating one example circuit that may be used to implement a portion of the phase shift clock, in accordance with one or more techniques from this disclosure.

FIG. 3 is a schematic diagram illustrating one example circuit that may be used to implement a portion of the phase shift clock, in accordance with one or more techniques from this disclosure. FIG. 3 illustrates a portion of the internal logic 22 and other components of phase shift clock 20 shown in FIGS. 1 and 2. The description of FIG. 3 below will focus on the structure of example clock phase shift circuit 20A. Further details of the operation of an example clock phase shift circuit will be detailed in the context of timing diagrams illustrated by FIGS. 4-6.

Example phase shift clock 20A may include a plurality of oscillator circuits 10A-10N, a voltage reference 18 with value V18 and control and output circuit 5. Each oscillator circuit 10A-10N may include similar elements. For example, oscillator circuit 10A may include a capacitive storage 11A, a charging circuit 12A controlled by switch S12A, a discharging circuit 13A controlled by switch S13A and a threshold detector 17a. Voltage reference 18 may connect to an input for each threshold detector 17a-17n to provide voltage reference value V18 to each threshold detector. The output of each threshold detector 17a-17n may connect to control and output circuit 5, delivering a trigger signal CLKa-CLKn to control and output circuit 5.

Example clock phase shift circuit 20A, depicts two oscillator circuits 10A and 10N. However, clock phase shift circuit 20A may include two, four, eight or any number of oscillator circuits. Other examples may include more, fewer or different components to implement the same functions as clock phase shift circuit 20A as shown in FIG. 3. In one example, clock phase shift circuit 20A may include four oscillator circuits (e.g. 10A-10D). With four oscillator circuits, phase shift clock 20A may only increment of the phase shift of the second clock signal by increasing the phase shift relative to the master input clock. In other examples, phase shift clock 20A may only increment the phase shift in both directions (increasing and decreasing) relative to the master input clock signal by adding additional oscillator circuits. In another example, with no hold time, clock phase shift circuit 20A may include three oscillator circuits. Phase shift clock 20A may be implemented as an analog integrated circuit, rather than discrete components. Phase shift clock 20A may also be implemented by a microprocessor, FPGA, microcontroller or similar circuit.

Output and control circuit 5 may provide the phase shifted clock signal PS_CLK at an output and control the operation of the individual oscillator units 10A-10N through switch signals S12A-S12N and S13A-S13N. Internal logic 22 shown in FIG. 1 may include portions of output and control circuit 5.

Oscillator circuits 10A-10N may provide the timing and trigger functions to output a second phase shifted clock output signal PS_CLK based the master input clock. The oscillator circuits include charging current units 12 and discharging units 13 that alternately charge and capacitive storage elements 11. By controlling the charging current and measuring the capacitive storage element discharge period, the oscillator circuits may determine the phase shift of output clock signal PS_CLK. For simplicity, the below description will focus on oscillator circuit 10A. All other oscillator circuits have the same structure and function.

Capacitive storage element 11A (capacitor 11A, for short) may connect the comparison input of threshold detector 17a to ground. Thus, threshold detector 17a may measure the voltage V11A of capacitor 11A. Charging current unit 12A connects a supply voltage V+ to the positive plate of capacitor 11A. Discharging current unit 13A connects the positive plate of capacitor 11A to ground. The terms charging current unit and charging circuit as well as discharging current unit and discharge circuit may be used interchangeably. The example of FIG. 3 depicts the supply voltage to be positive compared to ground, however, in other examples the supply voltage may be configured to be negative compared to ground.

Capacitive storage element 11A may be implemented such that it has a linear capacitance. A linear capacitance means that the voltage across each capacitive storage element increases approximately linearly when the charge stored in the capacitive storage element increases linearly. The capacitive charge storage elements can be implemented as conventional capacitors, such as plate capacitors, as a coupling capacitance between lines, or as a MOS capacitor.

Threshold detector 17A may determine when capacitor 11A reaches a threshold voltage. Threshold detector 17A may compare the capacitor voltage V11A to reference voltage V18. In the example of clock phase shift circuit 20A, threshold detector 17A may detect when capacitor voltage V11A reaches a predetermined discharge voltage. Because all threshold detectors 17A-17N may use reference voltage 18 as the detection threshold, all oscillator circuits 10A-10N may discharge to the same discharge voltage.

The threshold detectors 17A-17N may be implemented as comparators, as illustrated in FIG. 3. However, this is only an example. Each threshold detectors 17A-17N may also be implemented as Schmitt trigger, as inverter, or as an inverter chain with at least two inverters connected in series. For example, in a Schmitt trigger or an inverter the reference voltage may be internally generated, where the output signal of a Schmitt trigger or inverter changes each time an input signal reaches the internally generated threshold.

In the example of FIG. 3, when implemented as a comparator, threshold detector 17A may have a comparator delay. A comparator delay may be the delay between the time the input capacitor voltage V11A matches the predetermined threshold voltage V18 and the time the threshold detector 17A, or comparator 17A for short, outputs a trigger signal. In other words, capacitor voltage V11A may reach a predetermined discharge voltage, marking the end of a discharge period, but there may be an additional comparator delay before comparator 17A outputs a trigger signal indicating the end of the discharge period.

Discharging circuit 13A may be configured to discharge capacitor 11A as controlled by switch signal S13A. Control and output circuit 5 may synchronize switch signal S13A to the master input clock signal or the phase shifted output clock (PS_CLK). In the example of FIG. 3, discharging circuit 13A may be configured to discharge capacitor 11A at a fixed current I13A. Discharging capacitor 11A at a fixed current means that for each voltage level V11A, capacitor 11A will discharge for a specified discharge period when discharged to a final discharge voltage. For example, assuming discharge voltage is zero, when charging circuit 12A charges capacitor 11A to a maximum voltage, max(V11A), the discharge period will be twice as long as if charging circuit 12A charges capacitor 11A to half the max voltage, ½*max(V11A). In other words, discharging capacitor 11A at a fixed discharge current I13A from max(V11A) to a final discharge voltage may define a discharge period of $t_{max}$. Discharging capacitor 11A from ½*max(V11A) to the same final discharge voltage may define a discharge period of ½*$t_{max}$. Controlling the voltage level V11A will therefore control the discharge period. In other examples, with a non-zero discharge voltage, the discharge time is proportional to the charge voltage minus the discharge voltage.

Charging circuit 12A may be configured to charge capacitor 11A as controlled by switch signal S12A. Control and output circuit 5 may synchronize switch signal S12A to the master input clock signal or the phase shifted output clock (PS_CLK). Control and output circuit 5 may select a fixed charge time to activate and deactivate charging circuit 12A. For example, control and output circuit 5 may cause charging circuit 12A to charge capacitor 11A for one-half of the master input clock cycle. In the example of FIG. 3, charging circuit 12A may precisely control the charge current I12A between a minimum and maximum charge current. Other terms for charge current may include amperage level. By precisely controlling the charge current, or amperage level, for a fixed charging time, clock phase shift circuit 20A may control the final charge voltage V11A of capacitor 11A. Therefore, combined with a fixed discharge current I13A from discharge current circuit 13A, controlling the charge current I12A controls the discharge period. In other words, setting a precise charge current I12A means clock phase shift circuit 20A may determine a precise discharge period.

The maximum and minimum charging current may depend on the overall circuit configuration. For example, a minimum charge current of half the discharge current may ensure the discharge period is longer than the comparator delay. This may result in a minimum discharge period of one-quarter clock cycle. This may ensure the discharge period is longer than the comparator delay, and that the times for turning charging currents on and off are symmetrical when synchronized with either the master input clock or the phase shifted clock signal (PS_CLK). In some examples, a discharge time that is 2-3 times the comparator delay may be sufficient, especially if the system includes hold time 204.

All capacitors 11A-11N as well as the charging circuit components may be configured to give each oscillator circuit 10A-10N approximately equal charging and discharging performance. For example, for a given charge voltage $V_{charge}$ each oscillator circuit may define approximately the same discharge period. Manufacturing variation, which may occur because of lot-to-lot component differences and raw material or process variation, may result in some variation between oscillator circuits. Similarly, comparator delays between comparators 17A-17N may be approximately equal. Manufacturing variation may cause some differences between comparators.

The example circuit of FIG. 3 may offer advantages of a low complexity analog circuit for generating the phase shift clock and the quick start up time of only a few clock cycles. Timing diagrams shown in FIGS. 4-6 will explain the operation of the example circuit of FIG. 3 in more detail.

Figure 4:
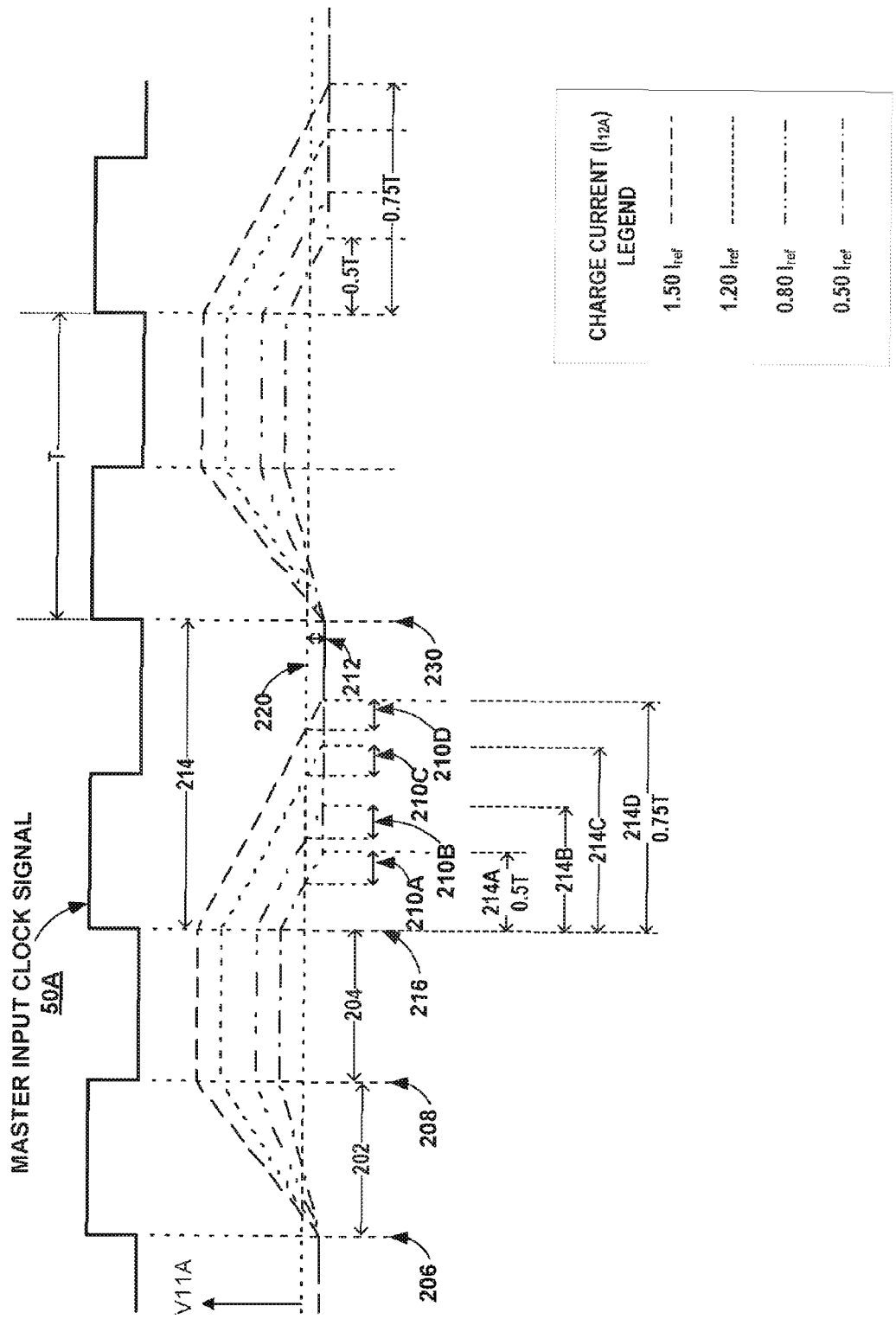
FIG. 4 is a timing diagram illustrating the operation of an oscillator circuit as depicted in FIG. 3.

FIG. 4 is a timing diagram illustrating the operation of an oscillator circuit as depicted in FIG. 3. FIG. 4 illustrates how the operation of oscillator circuit 10A may define a phase shift relative to the master input clock by defining the charge current delivered by charging circuit 12A.

FIG. 4 depicts the voltage of capacitor 11A (V11A) over several periods T of master input clock signal 50A. Capacitor 11A charges over charging period 202 beginning at 206 and ending after a fixed time at 208 at charging current $I_{12A}$. Capacitor 11A may include a holding time 204 and a discharge time 214. As described for FIG. 3 above, oscillator circuit 10A may include comparator 17A which may have a comparator delay 210 (210A-210D). The comparator delay 210 may result in a voltage difference 212 between the threshold voltage and the actual voltage V11A at the time comparator 17A outputs the trigger signal.

Charging period 202 is a fixed period of time synchronized to master input clock signal 50A. In the example of FIG. 4, charging period 202 may be set to 0.5T with the start of charging 206 set to the first rising edge of the positive ½ cycle of master input clock signal 50A. Master input clock signal 50A in this example is a clock with a fifty percent duty cycle. In other examples charging period 202 may be set to a different fraction of period T of master input clock signal 50A.

Charging current $I_{12A}$ starts at the beginning 206 of charging period 202 and stops at the end 208 of charging period 202. The example of FIG. 4 depicts charge current $I_{2A}$ at four different amperage levels, as shown by the different dashed lines in the legend box. These amperage levels may include $I_{12A}$ at four different multiples of $I_{ref}$ (1.50$I_{ref}$, 1.20$I_{ref}$, 0.80$I_{ref}$ and 0.50$I_{ref}$). Charging circuit 12A may select $I_{12A}$ to be any amperage level, not limited to the examples shown. Because charging circuit 12A applies charging current $I_{12A}$ for a predetermined time, the amperage level of charging current $I_{12A}$ defines the final voltage V11A at the end of the charging time 208.

By implementing a holding time 204 before discharging may improve the accuracy, because the comparator state has a longer time to settle. In the example of FIGS. 2B and 3, comparator 17A may change its internal state after V11A crosses threshold 220 in the positive direction. If the comparator internal state is not completely settled the comparator delay might not be completely independent of the time from the positive to the negative threshold crossing and therefore might depend on the charge current level. Holding time 204 as depicted by FIG. 4 is one-half a clock period (0.5T), however holding time 204 may be as low as zero in some examples. In another example, with no hold time 204, a clock phase shift circuit may include three oscillator circuits.

Discharge time 214 begins at an edge of the input clock. In this example it begins at the rising edge 216 of master input clock signal 50A. As the discharge current $I_{13A}$ is independent of the charge current setting $I_{12A}$ and may be constant, the falling slope may also be constant for any charge current amperage level $I_{12A}$. In other words, capacitor 11A discharges from final charge voltage V11A at a predefined time 216 with a predefined, constant current $I_{13A}$ until a voltage comparator 17A detects the crossing of a threshold 220 and then stops discharging. Threshold 220 is analogous to reference voltage V18 shown in FIG. 3. Therefore each different charging current amperage level may have a predetermined discharge time 214A-214D. For example, discharge time 214A may be one half master input clock period T while discharge time 214D may be ¾ of period T, also shown on the second cycle for clarity.

A comparator, such as comparator 17A, may have a comparator delay as described above for FIG. 3. Comparator delay 210 may include the time delay between when V11A reaches a predetermined threshold 220 and comparator 17A outputs a trigger signal indicating that V11A reached the predetermined threshold. Comparator delay 210A-210D may be a constant for comparator 17A because the slope of the discharge (i.e. the discharge current $I_{13A}$) is constant, as shown in the example of FIG. 4. The voltage difference 212 between the threshold voltage and the actual voltage V11A at the time comparator 17A outputs the trigger signal may therefore also be a constant for all charging current $I_{12A}$.

The overshoot of the discharge may result in a voltage difference 212 between the threshold and the final discharge voltage V11A of capacitor 11A. System 2 may preserve this voltage difference 212 for the next cycle as a starting point for the charge at time 230. This voltage difference 212 against the comparator threshold 202, or threshold voltage offset, may compensate the comparator delay 210 during the next cycle. In other words, the capacitor preserves a discharge voltage at the end of the discharge period as an initial charge voltage for a next charging cycle. Therefore, the generated discharge period delay time 214A-214D may be exactly proportional to the magnitude of the charge current. Magnitude of the charge current may also be described as charge current amperage level. As shown in FIG. 4, the times for turning currents on and off may be symmetrical and the generated discharge time 214A-214D may be long when compared to against the comparator delay 210A-210D.

Therefore, in some examples, the charge current $I_{12A}$ may have a minimum value. In the example shown in FIG. 4, the minimum amperage level of $I_{12A}$ may be half of the constant discharge current $I_{13A}$ (0.5$I_{ref}$). This may result in the corresponding a minimum discharge time 214A of one-quarter clock cycle. Discharge time 210 may also be referred to as "discharge time delay." As described in more detail in FIGS. 5-6 the minimum discharge time may correspond to the minimum phase shift of the second output clock relative to the master input clock signal 50A.

System 2 may also define a maximum amperage level of charging current $I_{12A}$. In the example of FIG. 4, the maximum amperage level may be 1.50$I_{ref}$. The maximum discharge time 214D corresponding to the maximum charging current may be 0.75T. Therefore, the maximum phase shift of the of the second output clock relative to the master input clock signal 50A may be 0.75T. As shown in the example of FIG. 4, the difference between the minimum and maximum discharge times (214A and 214D), and minimum and maximum phase shifts, is one half-cycle, or 180 degrees.

Figure 5:
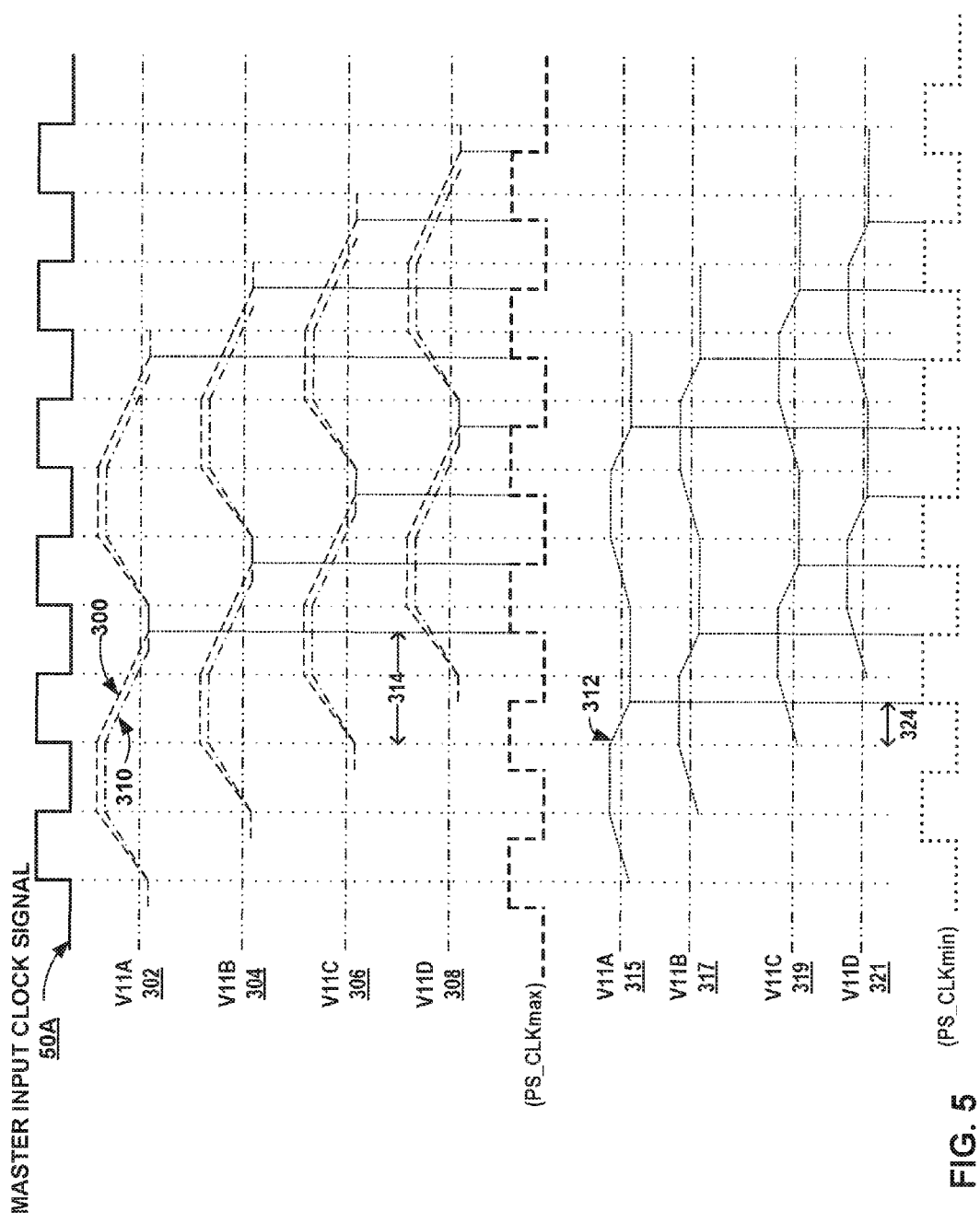
FIG. 5 is a timing diagram illustrating an example of incrementing the phase shift of a second output clock signal by utilizing four oscillator circuits.

FIG. 5 is a timing diagram illustrating an example of incrementing the phase shift of a second output clock signal by utilizing four oscillator circuits. In another example, with no hold time, clock phase shift circuit may include three oscillator circuits. The voltage V11A is analogous to the voltage on capacitor 11A in oscillator circuit 10A as shown in FIG. 3. Voltages V11B-V11D may be analogous to oscillator circuits 10B-10D, not shown in FIG. 3.

FIG. 5 depicts master input clock signal 50A, which is the same master input clock signal described in FIGS. 1-4 above. FIG. 5 includes voltage levels timing V11A-V11D at different times along master input clock signal 50A. FIG. 5 depicts these different times along the same master input clock signal, for illustration. However in operation, the voltages V11A-V11D during the times for 302-308 would come before or come after the timing of voltages V11A-V11D during the times for 315-321.

The upper half of FIG. 5 depicts all four charging currents set to the maximum, e.g. 1.5$I_{ref}$. This results in the maximum voltage, the maximum discharge time 300 and the maximum phase shift 314. As an example for comparison, the upper half of FIG. 5 also depicts a voltage profile 310 for a charge current less than the maximum, 1.2$I_{ref}$. However, for clarity, FIG. 5 shows only the second output clock PS_CLKmax for the maximum charging current.

The lower half of FIG. 5 depicts the same four oscillator circuits with the charging current set to minimum. In this example the minimum may be 0.5$I_{ref}$. This may result in the minimum voltage profile, the minimum discharge time 312 and the minimum phase shift 324. As discussed for FIG. 4, in the example of FIG. 5 the difference between the second output clock corresponding to the maximum current PS_CLKmax and the second output clock for the minimum current PS_CLKmin is 180 degrees, or one half of a clock cycle (0.5T) for master input clock signal 50A.

In operation the upper half of FIG. 5 may depict the relationship between the master input clock 50A and the second output clock PS_CLKmax during a constant phase shift period, as described in FIG. 2B. Each charge current, e.g. $I_{12A}$-$I_{12D}$, for each oscillator circuit may be set to 1.5$I_{ref}$ resulting in a second output clock signal PS_CLKmax with a constant phase shift of 0.75T.

Similarly, the lower half of FIG. 5 illustrates the example of the charge current, e.g. $I_{12A}$-$I_{12D}$, for each oscillator circuit set to 0.5$I_{ref}$ resulting in a second output clock signal PS_CLKmin with a constant phase shift of 0.5T (324). Because the same oscillator circuits may deliver any setting of charge current between the minimum and maximum charge current, the voltage profiles depicted in 315-321 would be at a different time than those shown by 302-308. As one example, the constant phase shift period 168 in FIG. 2B may be analogous to the output shown by voltage profiles 315-321.

Figure 6:
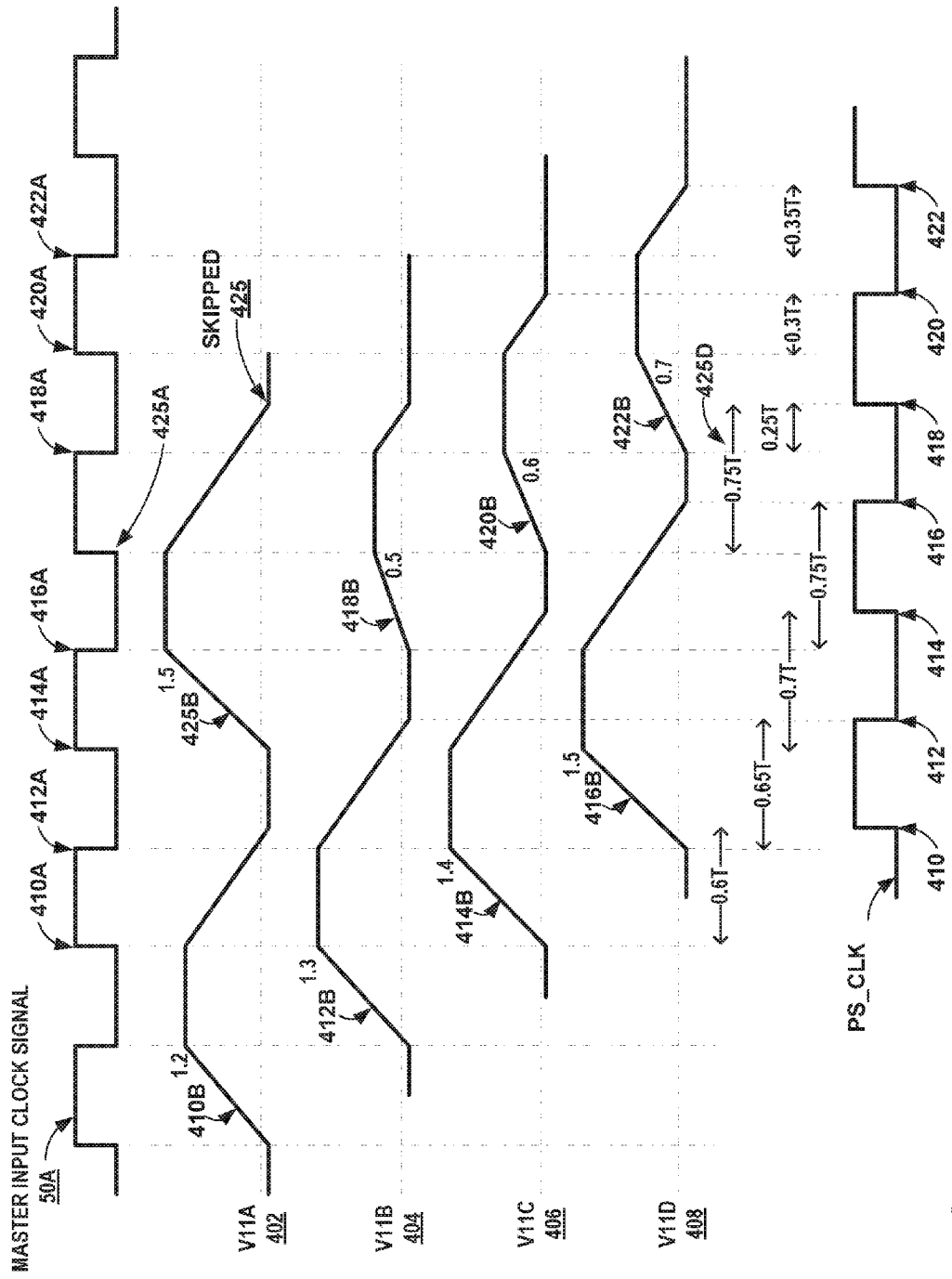
FIG. 6 is a timing diagram illustrating multiple cycles of the master input clock and how the phase shift increments from cycle to cycle in response to the charging current amperage level.

FIG. 6 is a timing diagram illustrating multiple cycles of the master input clock and how the phase shift increments from cycle to cycle in response to the charging current amperage level. FIG. 6 also illustrates how a clock phase shift circuit may incrementing the phase shift beyond the maximum phase shift by at least changing the charge current to the minimum amperage level, skipping one trigger signal and changing the state of the output clock signal on a next trigger signal.

FIG. 6 illustrates voltage profiles (V11A-V11D) for four oscillator circuits during a period when the clock phase shift circuit is incrementing the phase shift. The incrementing period illustrated by FIG. 6 may be analogous to the incrementing periods 162 and 165 depicted in FIG. 2B. Each oscillator circuit may increment the amperage level of the charging current (410B-425B), which may realize an incremented phase shift in the phase shifted clock signal PS_CLK relative to the master input clock signal 50A.

The description of increment phase will be in terms of the example clock phase shift circuit depicted in FIG. 3. An example phase shift incrementing sequence may start with voltage profile V11A (402). The charging current (410B) may be $1.2I_{ref}$ for a fixed, predetermined charge time. As with previous examples, the example predetermined charge time depicted in FIG. 6 is synchronized to one-half cycle of master input clock 50A. V11A remains at a final charge voltage for an example holding time of one-half cycle until the next cycle 410A of master input clock 50A triggers a discharge at a constant current. When comparator 17A detects that V11A equals a discharge threshold voltage, comparator 17A may output a trigger signal that both stops the discharge and toggles the state of the second output clock PS_CLK (410). Voltage profile V11A depicts a comparator delay and a voltage difference between the final voltage of V11A and the threshold voltage. This is discussed in more detail above in FIG. 4. Voltage profiles V11B-V11D depict a similar comparator delay and voltage difference.

During the V11A hold time for charging current 410B, the clock phase shift circuit may increment the charging current 412B to $1.3I_{ref}$ and charge the capacitor in the associated oscillator circuit for a fixed charge time of one-half cycle. The final voltage for V11B (404) may be greater than that for V11A (402) because the charging current amperage level 412B is $1.3I_{ref}$. This may result in an incremented discharge time and incremented phase shift for PS_CLK of 0.65T when the comparator trigger signal stops the discharge for V11B and changes the state of the second output clock signal PS_CLK (412). In other words, incrementing the charge current V11A at $1.2I_{ref}$ to V11B at $1.3I_{ref}$ may increment the phase shift difference between the master input clock 50A and second output clock signal PS_CLK. In the example of FIG. 6, the phase shift difference between the master input clock at 410A and PS_CLK at 410 is 0.6T while the phase shift difference between the master input clock at 412A and PS_CLK at 412 increments to 0.65T. The clock phase shift circuit may continue to increment the phase shift in a similar manner between 414 and 414A as well as 416 and 416A by increasingly incrementing the charging currents 414B and 416B respectively.

In the example of FIG. 6, the maximum charge current is $1.5I_{ref}$. To continue to increment an increase in the phase shift, the clock phase shift circuit may skip one comparator trigger signal and start incrementing the charge currents from the minimum charge current. This technique may provide an advantage that the clock phase shift circuit may increase the phase shift and exceed multiples of 360 degrees, yet the second clock signal may contain no discontinuities or short pulses. So circuits supplied by the output clock, such as the LLC control unit 130 in FIG. 2A, just "sees" a clock running at a lower frequency than the master input clock signal 50A during the increment periods when the phase shift is continuously increased. But circuits supplied by the output clock do not see any effects related to the skipped trigger signal 425.

The charging current 416B for V11D (408) is at the maximum, $1.5I_{ref}$ in this example. On the next cycle, V11A again sets the charging current 425B to $1.5I_{ref}$, but skips the trigger signal from the comparator 425 after V11A crosses the threshold. In other words, the clock phase shift circuit ignores the discharge time from V11A and the associated trigger signal. Instead, the clock phase shift circuit sets the charge current 418B for V11B (404) to the minimum $0.5I_{ref}$. The clock phase shift circuit changes the state of the second output clock S_CLK on the next trigger signal, which comes after the discharge time for V11B (404). This may result in a phase shift from 418A to 418 of 0.25. Note that this is the same as the phase shift of 0.75T (425D) from the skipped cycle 425A to 418. Therefore, the output of the phase shift clock PS_CLK had no short pulse or discontinuity because of the skipped trigger 425. Note that the oscillator circuits whose trigger signals caused the second output clock signal PS_CLK to transition from low-to-high may be inverted and cause PS_CLK to transition from high-to-low after a skipped trigger 425. The output clock changes state (toggles) each time a discharge period ends, except for skipped periods.

The phase shift clock may continue to increment the phase shift by incrementing the charge current amperage levels as shown in 420B for V11C (406) and 422B for V11D (408). This may result in incremented phase shifts between 420A and 420 as well as 422A and 422 of 0.3T and 0.35T respectively. This may continue until an oscillator circuit reaches the maximum current again of $1.5I_{ref}$. The clock phase shift circuit may perform a similar sequence to skip a trigger signal from an oscillator circuit and start incrementing the charge current from the minimum charge current of $0.5I_{ref}$.

The example of FIG. 6 depicts using four oscillator circuits. By using four oscillator circuits the phase shift of the second output clock PS_CLK may increase relative to the master input clock 50A. To both increase and decrease the second output clock relative to the master input clock may require additional oscillator circuits. With four oscillator circuits, skipping a trigger may not be reversed, therefore the phase shift delay may only increment as an increase relative to the master input clock. To reduce the phase shift in the other direction and generate a clock frequency which is above the input frequency, at least two additional oscillator circuits would be needed having their charge interval with the same charge time but with different charge current levels, leading to a total of more than 4 oscillator circuits. This may significantly increase the complexity. A less complex solution that only increases the delay, generating a frequency below or equal to the input frequency, may have advantages over a more complex solution.

Figure 7:
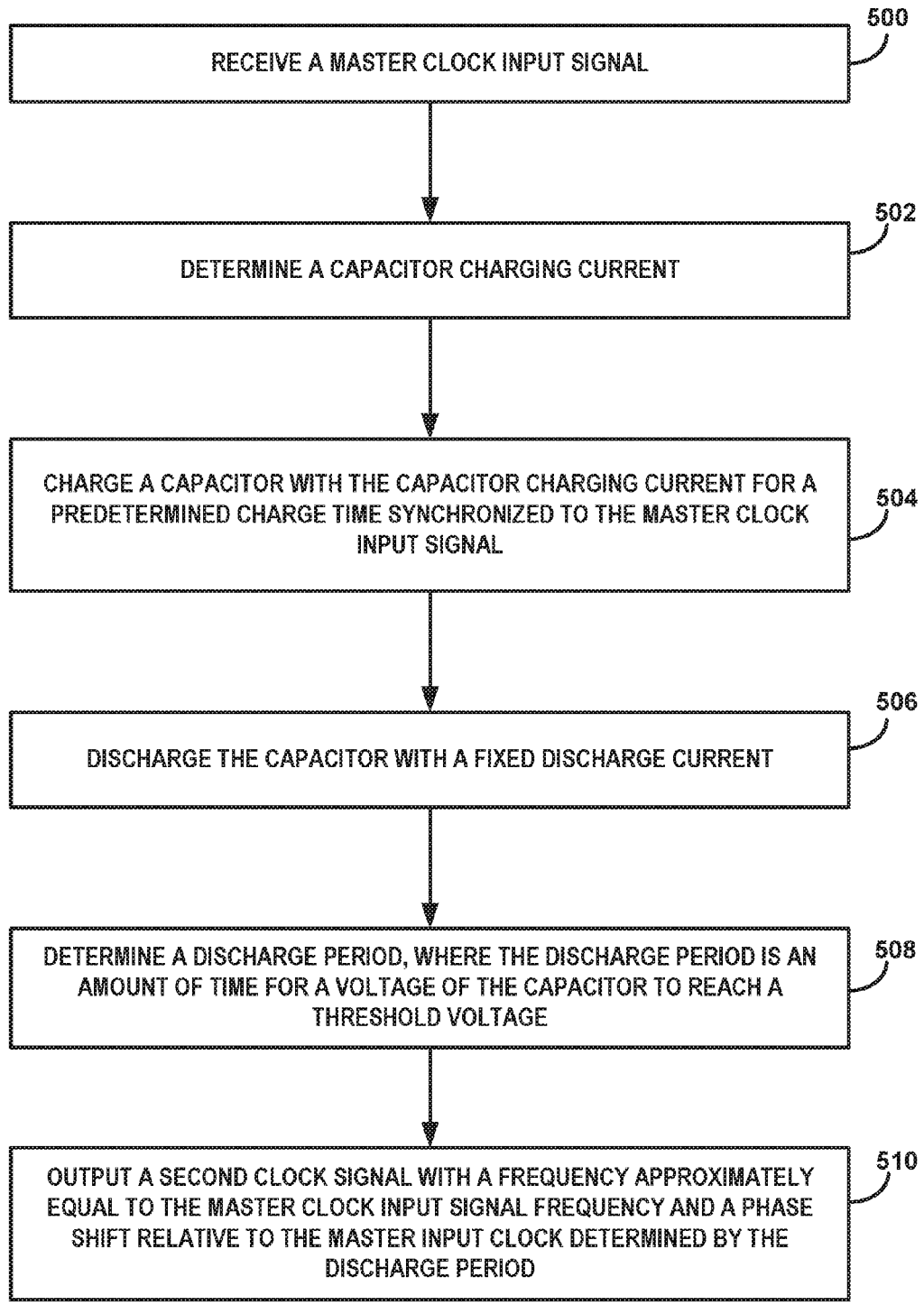
FIG. 7 is a flowchart illustrating a technique to generate a phase shifted clock signal in accordance with this disclosure

FIG. 7 is a flowchart illustrating a technique to generate a phase shifted clock signal in accordance with this disclosure. The description of FIG. 7 will be in the context of the schematic diagram of FIG. 3 and the timing diagram of FIG. 4, unless otherwise noted.

Clock phase shift circuit 20A may receive a master clock input signal 50A (500). Master input clock signal 50A may be configured as a 50% duty cycle clock at a predetermined master clock frequency such as 50 MHz, 100 MHz, or other frequency.

Clock phase shift circuit 20A may determine a capacitor charging current (502) $I_{12A}$ to realize a predetermined discharge time 210 and phase shift. Clock phase shift circuit 20A may determine capacitor charging current $I_{12A}$ to be at any amperage level between a minimum and a maximum amperage level.

Clock phase shift circuit 20A may start to charge capacitor 11A with the capacitor charging current $I_{12A}$ for a predetermined charge time synchronized to the master clock input signal 202 (504). In the example of FIG. 4, the predetermined charge time is one-half clock cycle. At the end of the predetermined charge time 208, clock phase shift circuit 20A may hold capacitor voltage V11A for a hold time 204.

The next transition 216 of master input clock signal 50A may trigger the capacitor to discharge with a fixed discharge current $I_{13A}$ (506). Comparator 17A may monitor capacitor voltage V11A and output a trigger signal to halt the discharge when V11A reaches a threshold voltage V18. Comparator 17D may include a comparator delay 210 that may result in a voltage threshold offset 212.

Clock phase shift circuit 20A may determine a discharge period, where the discharge period is an amount of time from the start of the discharge period 216 until the voltage of the capacitor V11A reaches a threshold voltage V18 (508). Because each charge current amperage level may result in a different final charge voltage V11A, the discharge period 214A-214D may be different for each charge current amperage level.

As shown in FIG. 5, clock phase shift circuit 20A may output a second clock signal PS_CLK with a frequency approximately equal to the master clock input signal 50A frequency (510). The phase shift relative to the master input clock of the second output clock signal PS_CLK may be determined by the length of the discharge period associated with a charge current. A clock phase shift circuit may repeat the steps in FIG. 7 for other oscillator circuits within the clock phase shift circuit. In this way, a clock phase shift circuit may generate a second clock signal with a predetermined phase shift relative to a master input clock signal.

Example 1

A system comprising: a master input clock; a clock phase shift circuit, configured to: output a second clock signal wherein a second clock signal frequency is approximately the same frequency as a master input clock frequency, and increment a phase shift of the second clock signal relative to the master input clock; and a control unit configured to: receive the second clock signal, generate a driver signal at a predetermined frequency, wherein the phase shift of the second clock signal relative to the master input clock sets a fractional part of a frequency ratio between the master input clock frequency and the predetermined frequency.

Example 2

The system of example 1, wherein the predetermined frequency of the driver signal comprises an integer part generated by counting clock cycles of the master input clock and the fractional part generated by shifting the phase of the second clock signal.

Example 3

The system of example 2, wherein the integer part comprises a multiple of the master input clock generated by counting clock cycles of the second clock signal.

Example 4

The system of any of examples 1-3, wherein the second clock signal contains no discontinuities or short pulses when the phase shift exceeds multiples of 360 degrees.

Example 5

The system of any of examples 1-4, wherein the clock phase shift circuit increments the phase shift based on a phase control word.

Example 6

The system of any of examples 1-5, wherein the clock phase shift circuit is further configured to increment the phase during times when there is no time event and fix the phase during times where there is a time event.

Example 7

The system of any of examples 1-6, wherein the driver signal is an LLC half-bridge driver signal.

Example 8

The system of any of examples 1-7, wherein the increment of the phase shift of the second clock signal increases relative to the master input clock.

Example 9

A clock circuit comprising, a capacitor; a capacitor discharge period, wherein the capacitor discharge period includes a duration comprising the time between a start of the capacitor discharge period and an end of the capacitor discharge period; a charging current unit configured to generate a charging current at a plurality of amperage levels, wherein: the charging current charges the capacitor for a predetermined charge time, and the predetermined charge time is synchronized to a master input clock that defines a master input clock frequency; a discharge current unit configured to: discharge the capacitor at a fixed, constant discharge current, start the capacitor discharge period at a predetermined delay after an end of the predetermined charge time; and a comparator configured to output a trigger signal in response to detecting a voltage across the capacitor crossing a predetermined threshold indicating an end of the capacitor discharge period; and wherein the clock circuit is configured to: generate a second clock signal, wherein the second clock signal includes a phase shift relative to the master input clock and the duration of the capacitor discharge period determines the phase shift.

Example 10

The clock circuit of example 9, wherein the trigger signal from the comparator changes the state of the second clock signal.

Example 11

The clock circuit of any of examples 9-10, wherein the master clock comprises a plurality of cycles and wherein the phase shift increments from cycle to cycle in response to the charging current amperage level.

Example 12

The clock circuit of any of examples 9-11, the capacitor preserves a discharge voltage at the end of the discharge period as an initial charge voltage for a next charging cycle.

Example 13

The clock circuit of any of examples 9-12, wherein: the charging current defines a maximum amperage level and a minimum amperage level, a maximum phase shift of the second clock signal corresponds to the maximum amperage level a minimum phase shift of the second clock signal corresponds to the minimum amperage level, and wherein the maximum phase shift is approximately 180 degrees different from the minimum phase shift.

Example 14

The clock circuit of example 13, wherein the clock circuit is further configured to increment the phase shift beyond the maximum phase shift by at least: changing the charge current to the minimum amperage level; skipping one trigger signal; and changing the state of the second clock signal on a next trigger signal.

Example 15

A method comprising: receiving, by a clock phase shift circuit, a master clock input signal, wherein the master clock input signal comprises a master clock input signal frequency; determining, by a clock phase shift circuit, a capacitor charging current; charging a capacitor, by a clock phase shift circuit, with the capacitor charging current for a predetermined charge time, wherein the predetermined charge time is synchronized to the master clock input signal; discharging the capacitor, by the clock phase shift circuit, with a fixed discharge current; determining, by the clock phase shift circuit, a discharge period, wherein the discharge period is an amount of time for a voltage of the capacitor to reach a threshold voltage; outputting, by the clock phase shift circuit, a second clock signal, wherein: a second clock signal frequency is approximately equal to the master clock input signal frequency, the second clock signal includes a phase shift relative to the master input clock and the discharge period determines the phase shift.

Example 16

The method of example 15, further comprising preserving, by the clock phase shift circuit, a threshold voltage offset of the capacitor at the end of the discharge period as an initial charge voltage for a next charging cycle.

Example 17

The method of any of examples 15-16, further comprising changing, by the clock phase shift circuit, the state of the second clock signal at an end of the discharge period, wherein the clock phase shift circuit comprises a comparator configured to determine when the discharge voltage of the capacitor reaches a threshold voltage.

Example 18

The method of any of examples 15-17, wherein the master input clock comprises a plurality of cycles, the method further comprising incrementing the phase shift of the second clock from cycle to cycle in response to the determined charging current.

Example 19

The method of example 18, wherein: the determined charging current defines a maximum amperage level and a minimum amperage level, a maximum phase shift of the second clock signal corresponds to the maximum amperage level a minimum phase shift of the second clock signal corresponds to the minimum amperage level, and wherein the maximum phase shift is approximately 180 degrees different from the minimum phase shift.

Example 20

The method of example 19, further comprising, incrementing the phase shift beyond the maximum phase shift by at least: changing the charge current to the minimum amperage level; skipping one trigger signal; and changing the state of the second clock signal on a next trigger signal.

Various examples of the disclosure have been described. These and other examples are within the scope of the following claims.

The invention claimed is:

1. A clock circuit comprising,
a capacitor;
a capacitor discharge period, wherein the capacitor discharge period includes a duration comprising the time between a start of the capacitor discharge period and an end of the capacitor discharge period;
a charging current unit, responsive to a single input clock signal and configured to generate a charging current at a plurality of amperage levels, wherein:
the charging current charges the capacitor for a predetermined charge time, and
the predetermined charge time is synchronized to the single input clock signal that defines a master input clock frequency;
a discharge current unit configured to:
discharge the capacitor at a fixed, constant discharge current,
start the capacitor discharge period at a predetermined delay after an end of the predetermined charge time; and
a comparator configured to output a trigger signal in response to detecting a voltage across the capacitor crossing a predetermined threshold indicating an end of the capacitor discharge period; and
wherein the clock circuit is configured to:
generate a second clock signal, wherein the second clock signal includes a phase shift relative to the master input clock and the duration of the capacitor discharge period determines the phase shift.

2. The clock circuit of claim 1, wherein the trigger signal from the comparator changes the state of the second clock signal.

3. The clock circuit of claim 1, wherein the single input clock signal comprises a plurality of cycles and wherein the phase shift increments from cycle to cycle in response to the charging current amperage level.

4. The clock circuit of claim 1, the capacitor preserves a discharge voltage at the end of the discharge period as an initial charge voltage for a next charging cycle.

5. The clock circuit of claim 1, wherein:
the charging current defines a maximum amperage level and a minimum amperage level,
a maximum phase shift of the second clock signal corresponds to the maximum amperage level
a minimum phase shift of the second clock signal corresponds to the minimum amperage level, and wherein the maximum phase shift is approximately 180 degrees different from the minimum phase shift.

6. The clock circuit of claim 5, wherein the clock circuit is further configured to increment the phase shift beyond the maximum phase shift by at least:
changing the charge current to the minimum amperage level;
skipping one trigger signal; and
changing the state of the second clock signal on a next trigger signal.

7. A method comprising:
receiving, by a clock phase shift circuit, a single input clock signal, wherein the single input clock signal comprises a master input clock frequency;
determining, by the clock phase shift circuit, a capacitor charging current;
charging a capacitor, by the clock phase shift circuit, with the capacitor charging current for a predetermined charge time, wherein the predetermined charge time is synchronized to the single input clock signal;
discharging the capacitor, by the clock phase shift circuit, with a fixed discharge current;
determining, by the clock phase shift circuit, a discharge period, wherein the discharge period is an amount of time for a voltage of the capacitor to reach a threshold voltage;
outputting, by the clock phase shift circuit, a second clock signal, wherein:
a second clock signal frequency is approximately equal to the master input clock frequency,
the second clock signal includes a phase shift relative to the single input clock signal and the discharge period determines the phase shift.

8. The method of claim 7, further comprising preserving, by the clock phase shift circuit, a threshold voltage offset of the capacitor at the end of the discharge period as an initial charge voltage for a next charging cycle.

9. The method of claim 7, further comprising changing, by the clock phase shift circuit, the state of the second clock signal at an end of the discharge period, wherein the clock phase shift circuit comprises a comparator configured to determine when the discharge voltage of the capacitor reaches a threshold voltage.

10. The method of claim 6, wherein the single input clock signal comprises a plurality of cycles, the method further comprising incrementing the phase shift of the second clock from cycle to cycle in response to the determined charging current.

11. The method of claim 10, wherein:
the determined charging current defines a maximum amperage level and a minimum amperage level,
a maximum phase shift of the second clock signal corresponds to the maximum amperage level
a minimum phase shift of the second clock signal corresponds to the minimum amperage level, and wherein the maximum phase shift is approximately 180 degrees different from the minimum phase shift.

12. The method of claim 11, further comprising, incrementing the phase shift beyond the maximum phase shift by at least:
changing the charge current to the minimum amperage level;
skipping one trigger signal; and
changing the state of the second clock signal on a next trigger signal.

* * * * *